(12) United States Patent
Palanki et al.

(10) Patent No.: US 7,864,819 B2
(45) Date of Patent: Jan. 4, 2011

(54) METHOD AND APPARATUS FOR BIT DEMULTIPLEXING IN A WIRELESS COMMUNICATION SYSTEMS

(75) Inventors: Ravi Palanki, San Diego, CA (US); Aamod Khandekar, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 171 days.

(21) Appl. No.: 12/091,628

(22) PCT Filed: Oct. 27, 2006

(86) PCT No.: PCT/US2006/042598

§ 371 (c)(1),
(2), (4) Date: Oct. 6, 2008

(87) PCT Pub. No.: WO2007/051072

PCT Pub. Date: May 3, 2007

(65) Prior Publication Data

US 2009/0220033 A1 Sep. 3, 2009

Related U.S. Application Data

(60) Provisional application No. 60/731,128, filed on Oct. 27, 2005.

(51) Int. Cl.
*H04J 3/02* (2006.01)

(52) U.S. Cl. ...................... 370/542; 370/536

(58) Field of Classification Search ............. None
See application file for complete search history.

(56) References Cited

U.S. PATENT DOCUMENTS

| 6,094,427 | A | 7/2000 | Yi |
| 2003/0053435 | A1* | 3/2003 | Sindhushayana et al. ..... 370/342 |

FOREIGN PATENT DOCUMENTS

| KR | 20087012772 | 8/2008 |
| WO | WO01/91355 A | 11/2001 |
| WO | WO02/062002 A | 8/2002 |
| WO | WO03/015289 A | 2/2003 |

OTHER PUBLICATIONS

Office Action mailed Nov. 25, 2009 for Korean Patent Application No. 2008-7012772 3 pages.

(Continued)

*Primary Examiner*—Huy D Vu
*Assistant Examiner*—James D Duffy
(74) *Attorney, Agent, or Firm*—Turocy & Watson, LLP

(57) ABSTRACT

A method and apparatus of bit demultiplexing for a rate 1/3 convolutional encoder in a wireless communication system, the method comprising, receiving bits from the rate-1/3 convolutional encoder, demultiplexing the received bits by distributing the bits sequentially into 3 sequences denoted as $V_0$, $V_1$ and $V_2$ such that the first bit is going to the $V_0$ sequence, the second bit is going to the $V_1$ sequence and the third bit is going to the $V_2$ sequence and ordering the sequences such that $V_0$ is the first sequence, $V_1$ is the second sequence and $V_2$ is the third sequence.

4 Claims, 7 Drawing Sheets

OTHER PUBLICATIONS

3GPP TS 25.212 V5.0.0(Mar. 2003);3rd Generation Partnership Project; Technical Specification Group Radio Access network; Multiplexing and Channel Coding (FDD) Release 5) 74 pages.

Office Action mailed May 25, 2009 for Korean Patent Application No. 2008-7012772 2 pages.

Office Action mailed Apr. 7, 2010 for European Patent Application No. 06827242.6, 2 pages.

International Search Report and Written Opinion dated Apr. 3, 2007 for PCT Application No. PCT/US2006/042598, 15 pages.

* cited by examiner

METHOD AND APPARATUS FOR BIT DEMULTIPLEXING IN A WIRELESS COMMUNICATION SYSTEMS

CLAIM OF PRIORITY UNDER 35 U.S.C. §119

The present Application for Patent claims priority to Provisional Application Ser. No. 60/731,128, entitled "WIRELESS COMMUNICATION", filed Oct. 27, 2005, assigned to the assignee hereof, and expressly incorporated herein by reference.

BACKGROUND

1. Field

The present disclosure relates generally to wireless communications, and more particularly to methods and apparatus for Bit Demultiplexing in a wireless communication system.

2. Background

Wireless communication systems have become a prevalent means by which a majority of people worldwide have come to communicate. Wireless communication devices have become smaller and more powerful in order to meet consumer needs and to improve portability and convenience. The increase in processing power in mobile devices such as cellular telephones has lead to an increase in, demands on wireless network transmission systems. Such systems typically are not as easily updated as the cellular devices that communicate there over. As mobile device capabilities expand, it can be difficult to maintain an older wireless network system in a manner that facilitates fully exploiting new and improved wireless device capabilities.

Wireless communication systems generally utilize different approaches to generate transmission resources in the form of channels. These systems may be code division multiplexing (CDM) systems, frequency division multiplexing (FDM) systems, and time division multiplexing (TDM) systems. One commonly utilized variant of FDM is orthogonal frequency division multiplexing (OFDM) that effectively partitions the overall system bandwidth into multiple orthogonal subcarriers. These subcarriers may also be referred to as tones, bins, and frequency channels. Each subcarrier can be modulated with data. With time division based techniques, a each subcarrier can comprise a portion of sequential time slices or time slots. Each user may be provided with a one or more time slot and subcarrier combinations for transmitting and receiving information in a defined burst period or frame. The hopping schemes may generally be a symbol rate hopping scheme or a block hopping scheme.

Code division based techniques typically transmit data over a number of frequencies available at any time in a range. In general, data is digitized and spread over available bandwidth, wherein multiple users can be overlaid on the channel and respective users can be assigned a unique sequence code. Users can transmit in the same wide-band chunk of spectrum, wherein each user's signal is spread over the entire bandwidth by its respective unique spreading code. This technique can provide for sharing, wherein one or more users can concurrently transmit and receive. Such sharing can be achieved through spread spectrum digital modulation, wherein a user's stream of bits is encoded and spread across a very wide channel in a pseudo-random fashion. The receiver is designed to recognize the associated unique sequence code and undo the randomization in order to collect the bits for a particular user in a coherent manner.

A typical wireless communication network (e.g., employing frequency, time, and/or code division techniques) includes one or more base stations that provide a coverage area and one or more mobile (e.g., wireless) terminals that can transmit and receive data within the coverage area. A typical base station can simultaneously transmit multiple data streams for broadcast, multicast, and/or unicast services, wherein a data stream is a stream of data that can be of independent reception interest to a mobile terminal. A mobile terminal within the coverage area of that base station can be interested in receiving one, more than one or all the data streams transmitted from the base station. Likewise, a mobile terminal can transmit data to the base station or another mobile terminal. In these systems the bandwidth and other system resources are assigned utilizing a scheduler.

The signals, signal formats, signal exchanges, methods, processes, and techniques disclosed herein provide several advantages over known approaches. These include, for example, reduced signaling overhead, improved system throughput, increased signaling flexibility, reduced information processing, reduced transmission bandwidth, reduced bit processing, increased robustness, improved efficiency, and reduced transmission power.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to one embodiment, a method is provided for receiving bits from rate-1/3 convolutional encoder, demultiplexing the received bits by distributing the bits sequentially into 3 sequences denoted as $V_0$, $V_1$ and $V_2$ such that the first bit is going to the $V_0$ sequence, the second bit is going to the $V_1$ sequence and the third bit is going to the $V_2$ sequence and ordering the sequences such that $V_0$ is the first sequence, $V_1$ is the second sequence and $V_2$ is the third sequence.

According to yet another embodiment, a computer readable medium is described which comprises a set of instructions for receiving bits from rate-1/3 convolutional encoder, a set of instructions for demultiplexing the received bits by distributing the bits sequentially into 3 sequences denoted as $V_0$, $V_1$ and $V_2$ such that the first bit is going to the $V_0$ sequence, the second bit is going to the $V_1$ sequence and the third bit is going to the $V_2$ sequence and a set of instructions for ordering the sequences such that $V_0$ is the first sequence, $V_1$ is the second sequence and $V_2$ is the third sequence.

According to yet another embodiment, an apparatus is described which comprises means for receiving bits from rate-1/3 convolutional encoder, means for demultiplexing the received bits by distributing the bits sequentially into 3 sequences denoted as $V_0$, $V_1$ and $V_2$ such that the first bit is going to the $V_0$ sequence, the second bit is going to the $V_1$ sequence and the third bit is going to the $V_2$ sequence and means for ordering the sequences such that $V_0$ is the first sequence, $V_1$ is the second sequence and $V_2$ is the third sequence.

According to one embodiment, a method is provided for receiving bits from rate 1/5 turbo encoder, demultiplexing the received bits by distributing the bits sequentially into five sequences denoted as U, $V_0$, $V_1$, $V_0'$ and $V_1'$ such that the first bit going to the U sequence, the second to the $V_0$ sequence, the third to the $V_1$ sequence, the fourth to the $V_0'$ sequence and the fifth going to the $V_1'$ sequence, distributing 18 tail bits numbered 0 through 17 such that tail bits numbered 0, 3, 6, 9, 12 and 15 go to U sequence, tail bits numbered 1, 4 and 7 go to the $V_0$ sequence, tail bits numbered 2, 5 and 8 go to the $V_1$ sequence, tail bits 10, 13 and 16 go to the $V_0'$ sequence and tail bits numbered 11, 14 and 17 go to the $V_1'$ sequence and ordering the sequences such that U is the first sequence, $V_0$ is the second sequence, $V_0'$ is the third sequence, $V_1$ is the fourth and $V_1'$ is the last sequence.

According to yet another embodiment, a computer readable medium is described which comprises a set of instructions for receiving bits from rate 1/5 turbo encoder, a set of instructions for demultiplexing the received bits by distributing the bits sequentially into five sequences denoted as U, $V_0$, $V_1$, $V_0'$ and $V_1'$ such that the first bit going to the U sequence, the second to the $V_0$ sequence, the third to the $V_1$ sequence, the fourth to the $V_0'$ sequence and the fifth going to the $V_1'$ sequence, a set of instructions for distributing 18 tail bits numbered 0 through 17 such that tail bits numbered 0, 3, 6, 9, 12 and 15 go to U sequence, tail bits numbered 1, 4 and 7 go to the $V_0$ sequence, tail bits numbered 2, 5 and 8 go to the $V_1$ sequence, tail bits 10, 13 and 16 go to the $V_0'$ sequence and tail bits numbered 11, 14 and 17 go to the $V_1'$ sequence and a set of instructions for ordering the sequences such that U is the first sequence, $V_0$ is the second sequence, $V_0'$ is the third sequence, $V_1$ is the fourth and $V_1'$ is the last sequence.

According to yet another embodiment, an apparatus is described which comprises means for receiving bits from rate 1/5 turbo encoder, means for demultiplexing the received bits by distributing the bits sequentially into five sequences denoted as U, $V_0$, $V_1$, $V_0'$ and $V_1'$ such that the first bit going to the U sequence, the second to the $V_0$ sequence, the third to the $V_1$ sequence, the fourth to the $V_0'$ sequence and the fifth going to the $V_1'$ sequence, means for distributing 18 tail bits numbered 0 through 17 such that tail bits numbered 0, 3, 6, 9, 12 and 15 go to U sequence, tail bits numbered 1, 4 and 7 go to the $V_0$ sequence, tail bits numbered 2, 5 and 8 go to the $V_1$ sequence, tail bits 10, 13 and 16 go to the $V_0'$ sequence and tail bits numbered 11, 14 and 17 go to the $V_1'$ sequence and means for ordering the sequences such that U is the first sequence, $V_0$ is the second sequence, $V_0'$ is the third sequence, $V_1$ is the fourth and $V_1'$ is the last sequence.

To the accomplishment of the foregoing and related ends, the one or more embodiments comprise the features hereinafter fully described and particularly pointed out in the claims. The following description and the annexed drawings set forth in detail certain illustrative embodiments of the one or more embodiments. These embodiments are indicative, however, of but a few of the various ways in which the principles of various embodiments may be employed and the described embodiments are intended to include all such embodiments and their equivalents.

DETAILED DESCRIPTION

Figure 1:
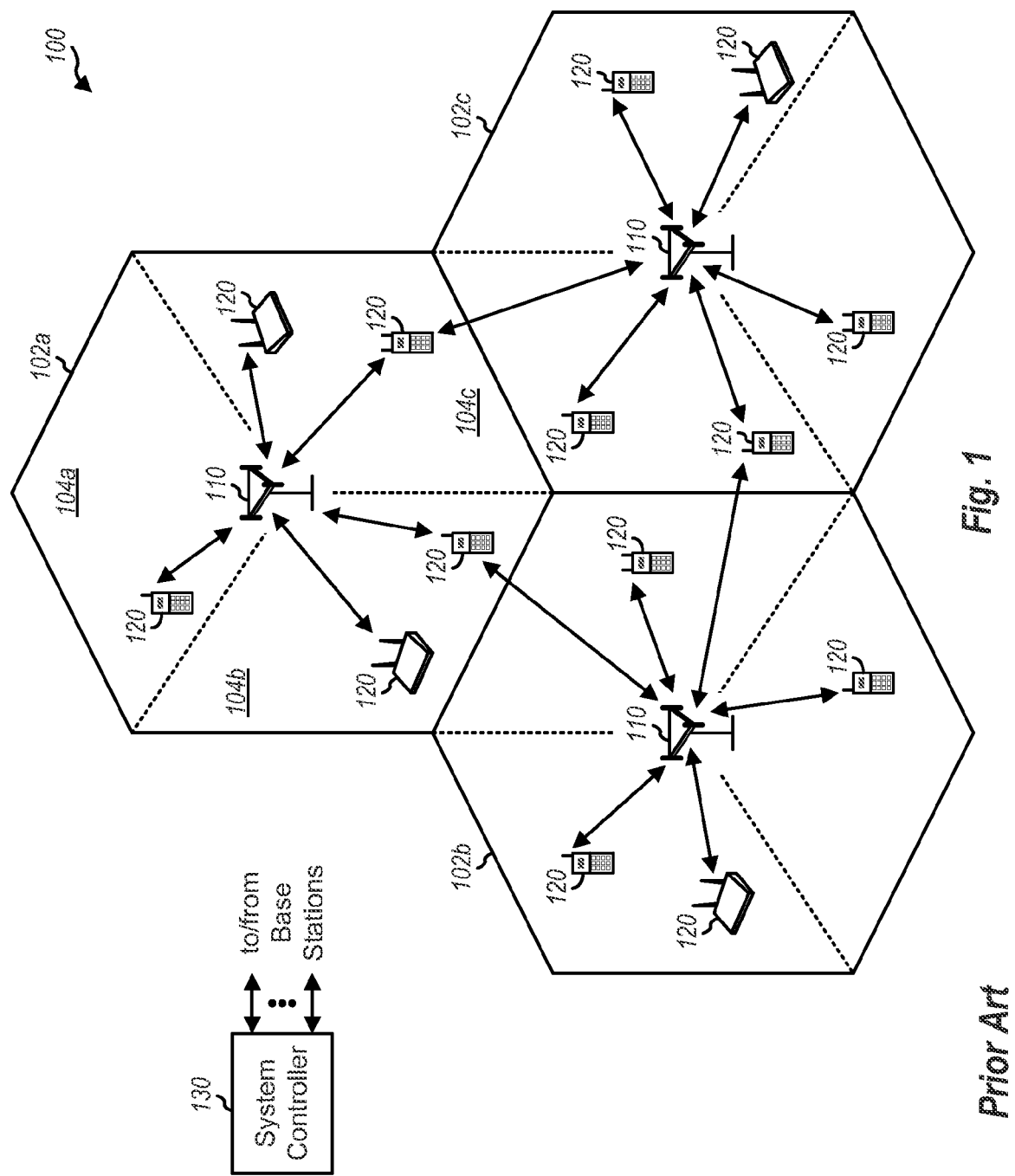
FIG. 1 illustrates embodiments of a multiple access wireless communication system.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

Referring to FIG. 1, a multiple access wireless communication system according to one embodiment is illustrated. A multiple access wireless communication system 100 includes multiple cells, e.g., 102a, 102b, and 102c. In the embodiment of FIG. 1, each cell 102a, 102b, and 102c may include an access point e.g., access point 110 that includes multiple sectors, e.g., 104a, 104b, and 104c. The multiple sectors are formed by groups of antennas knot shown) each responsible for communication with access terminals 120 in a portion of the cell. In cell 102a, antenna groups knot shown) each correspond to a different sector (e.g., 104a, 104b, and 104c). Similarly, in cells 102b and 102c, antenna groups (not shown) each respectively correspond to a different sector.

Each cell 102a, 102b, and 102c includes several access terminals 120 which are in communication with one or more sectors (e.g., 104a, 104b, and 104c) of each access point (e.g., access point 110). For example, in cell 102a access terminals 120 are in communication with access point 110. Controller 130 is coupled to each of the cells 102a, 102b, and 102c. Controller 130 may contain one or more connections to multiple networks, e.g. the Internet, other packet based networks, or circuit switched voice networks that provide information to, and from, the access terminals ke.g., access terminals 120) in communication with the cells of the multiple access wireless communication system 100. The controller 130 includes, or is coupled with, a scheduler that schedules transmission from and to access terminals. In other embodiments, the scheduler may reside in each individual cell, each sector of a cell, or a combination thereof.

As used herein, an access point fe.g., access point 110) may be a fixed station used for communicating with the terminals (e. g., access terminals 120) and may also be referred to as, and include some or all the functionality of, a base station, a Node B, or some other terminology. An access terminal fe.g., access terminals 120) may also be referred to as, and include some or all the functionality of, a user equipment (UE), a wireless communication device, terminal, a mobile station or some other terminology.

It should be noted that while FIG. 1, depicts physical sectors, i.e. having different antenna groups for different sectors, other approaches may be utilized. For example, utilizing multiple fixed "beams" that each cover different areas of the cell in frequency space may be utilized in lieu of, or in combination with physical sectors. Such an approach is depicted and disclosed in copending U.S. patent application Ser. No. 11/260,895, entitled "Adaptive Sectorization In Cellular System."

Figure 2:
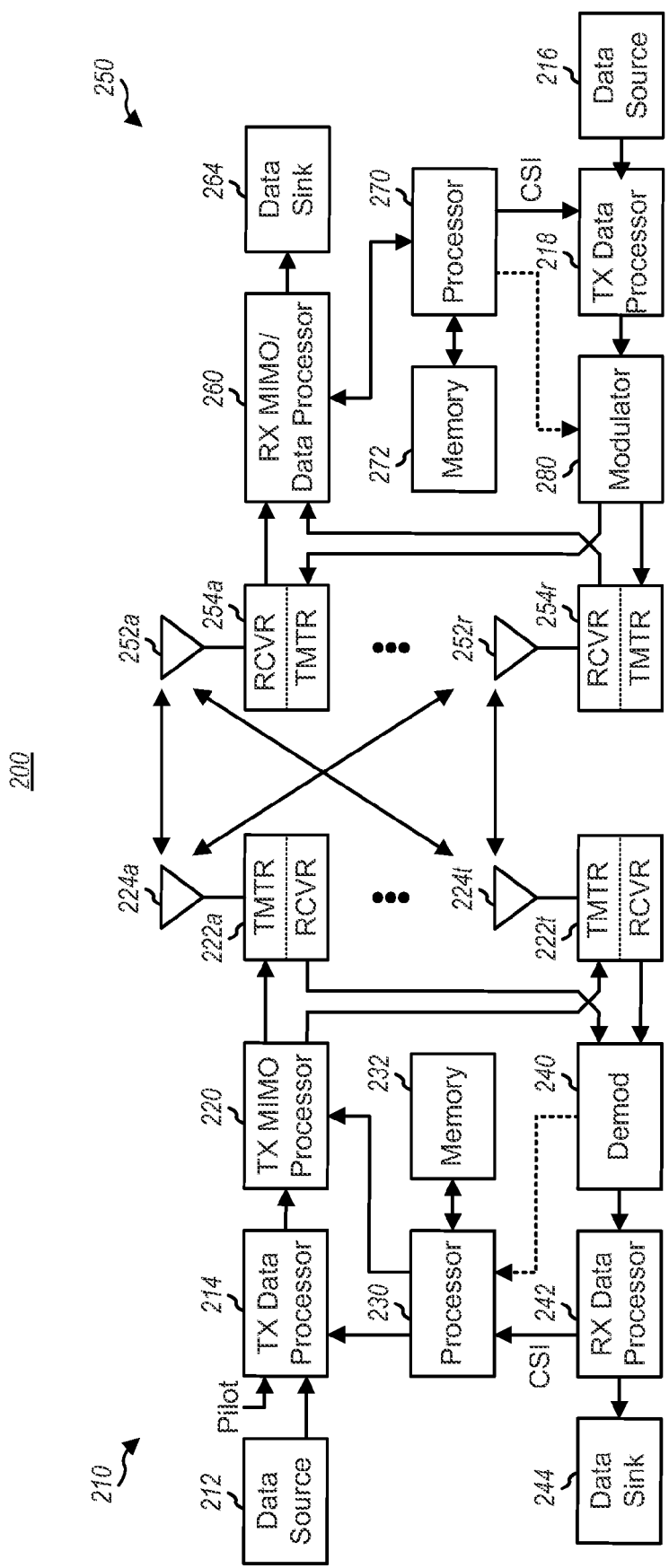
FIG. 2 illustrates embodiments of a transmitter and receiver in a multiple access wireless communication system.

Referring to FIG. 2, a block diagram of an embodiment of a transmitter system 210 and a receiver system 250 in a MIMO system 200 is illustrated. At transmitter system 210, traffic data for a number of data streams is provided from a data source 212 to transmit (TX) data processor 214. In an embodiment, each data stream is transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM, or other orthogonalization or non-orthogonalization techniques. The pilot data is typically a known data pattern that is processed in a known manner and may be used at the receiver system to estimate the channel response. The multiplexed pilot and coded data for each data stream is then modulated (i.e., symbol mapped) based on one or more particular modulation schemes (e.g., BPSK, QSPK, M-PSK, or M-QAM) selected for that data stream to provide modulation symbols. The data rate, coding, and modulation for each data stream may be determined by instructions performed on provided by processor 230.

The modulation symbols for all data streams are then provided to a TX processor 220, which may further process the modulation symbols (e.g., for OFDM). TX processor 220 then provides $N_T$ modulation symbol streams to $N_T$ transmitters (TMTR) 222a through 222t. Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals are received by $N_R$ antennas 252a through 252r and the received signal from each antenna 252 is provided to a respective receiver (RCVR) 254. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The processing by RX data processor 260 is described in further detail below. Each detected symbol stream includes symbols that are estimates of the modulation symbols transmitted for the corresponding data stream. RX data processor 260 then demodulates, deinterleaves, and decodes each detected symbol stream to recover the traffic data for the data stream. The processing by RX data processor 218 is complementary to that performed by TX processor 220 and TX data processor 214 at transmitter system 210.

RX data processor 260 may be limited in the number of subcarriers that it may simultaneously demodulate, e.g. 512 subcarriers or 5 MHz, and such a receiver should be scheduled on a single carrier. This limitation may be a function of its FFT range, e.g. sample rates at which the processor 260 may operate, the memory available for FFT, or other functions available for demodulation. Further, the greater the number of subcarriers utilized, the greater the expense of the access terminal.

The channel response estimate generated by RX processor 260 may be used to perform space, space/time processing at the receiver, adjust power levels, change modulation rates or schemes, or other actions. RX processor 260 may further estimate the signal-to-noise-and-interference ratios (SNRs) of the detected symbol streams, and possibly other channel characteristics, and provides these quantities to a processor 270. RX data processor 260 or processor 270 may further derive an estimate of the "operating" SNR for the system. Processor 270 then provides channel state information (CSI), which may comprise various types of information regarding the communication link and/or the received data stream. For example, the CSI may comprise only the operating SNR. In other embodiments, the CSI may comprise a channel quality indicator (CQI), which may be a numerical value indicative of one or more channel conditions. The CSI is then processed by a TX data processor 278, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to recover the CSI reported by the receiver system. The reported CSI is then provided to processor 230 and used to (1) determine the data rates and coding and modulation schemes to be used for the data streams and (2) generate various controls for TX data processor 214 and TX processor 220. Alternatively, the CSI may be utilized by processor 270 to determine modulation schemes and/or coding rates for transmission, along with other information. This may then be provided to the transmitter which uses this information, which may be quantized, to provide later transmissions to the receiver.

Processors 230 and 270 direct the operation at the transmitter and receiver systems, respectively. Memories 232 and 272 provide storage for program codes and data used by processors 230 and 270, respectively.

At the receiver, various processing techniques may be used to process the $N_R$ received signals to detect the $N_T$ transmitted symbol streams. These receiver processing techniques may be grouped into two primary categories (i) spatial and space-time receiver processing techniques (which are also referred to as equalization techniques); and (ii) "successive nulling/equalization and interference cancellation" receiver processing technique (which is also referred to as "successive interference cancellation" or "successive cancellation" receiver processing technique).

While FIG. 2 discusses a MIMO system, the same system may be applied to a multi-input single-output system where multiple transmit antennas, e.g. those on a base station, transmit one or more symbol streams to a single antenna device, e.g. a mobile station. Also, a single output to single input antenna system may be utilized in the same manner as described with respect to FIG. 2.

The transmission techniques described herein may be implemented by various means. For example, these techniques may be implemented in hardware, firmware, software, or a combination thereof. For a hardware implementation, the processing units at a transmitter may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. The processing units at a receiver may also be implemented within one or more ASICs, DSPs, processors, and so on.

For a software implementation, the transmission techniques may be implemented with processors (e.g., procedures, functions, and so on) that perform the functions described herein. The software codes may be stored in a memory (e.g., memory 232 or 272 in FIG. 2) and executed by a processor (e.g., processor 230 or 270). The memory may be implemented within the processor or external to the processor.

It should be noted that the concept of channels herein refers to information or transmission types that may be transmitted by the access point or access terminal. It does not require or utilize fixed or predetermined blocks of subcarriers, time periods, or other resources dedicated to such transmissions.

Figure 3A:
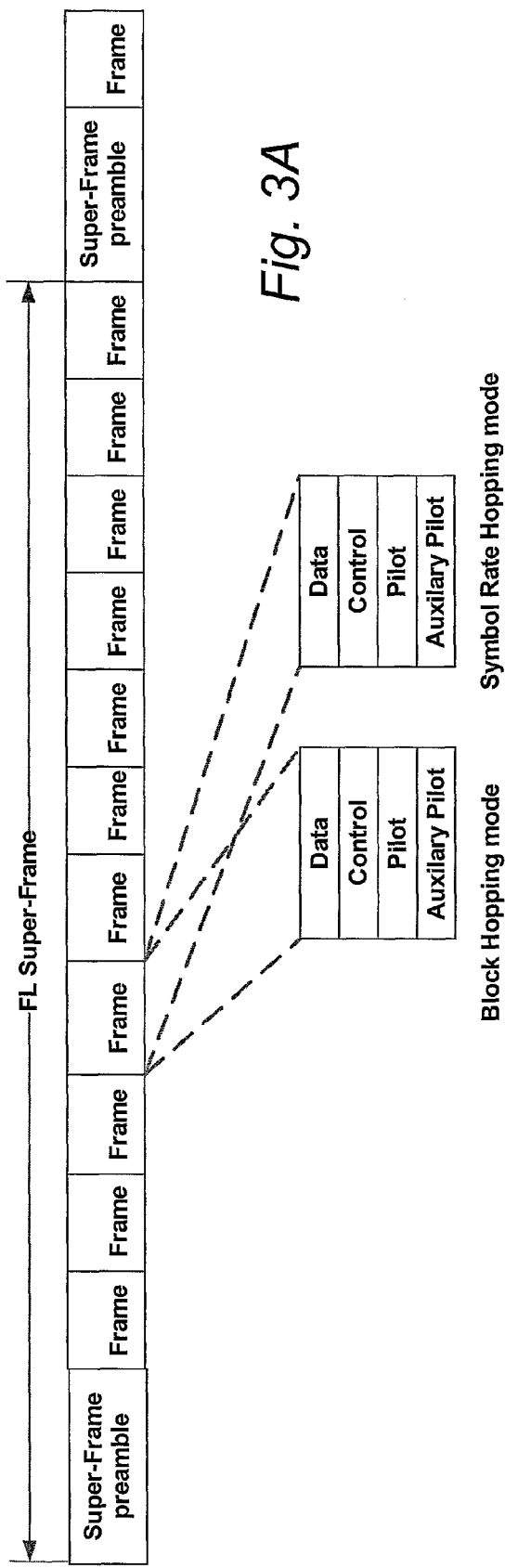
FIGS. 3A and 3B illustrate embodiments of superframe structures for a multiple access wireless communication system.
Figure 3B:
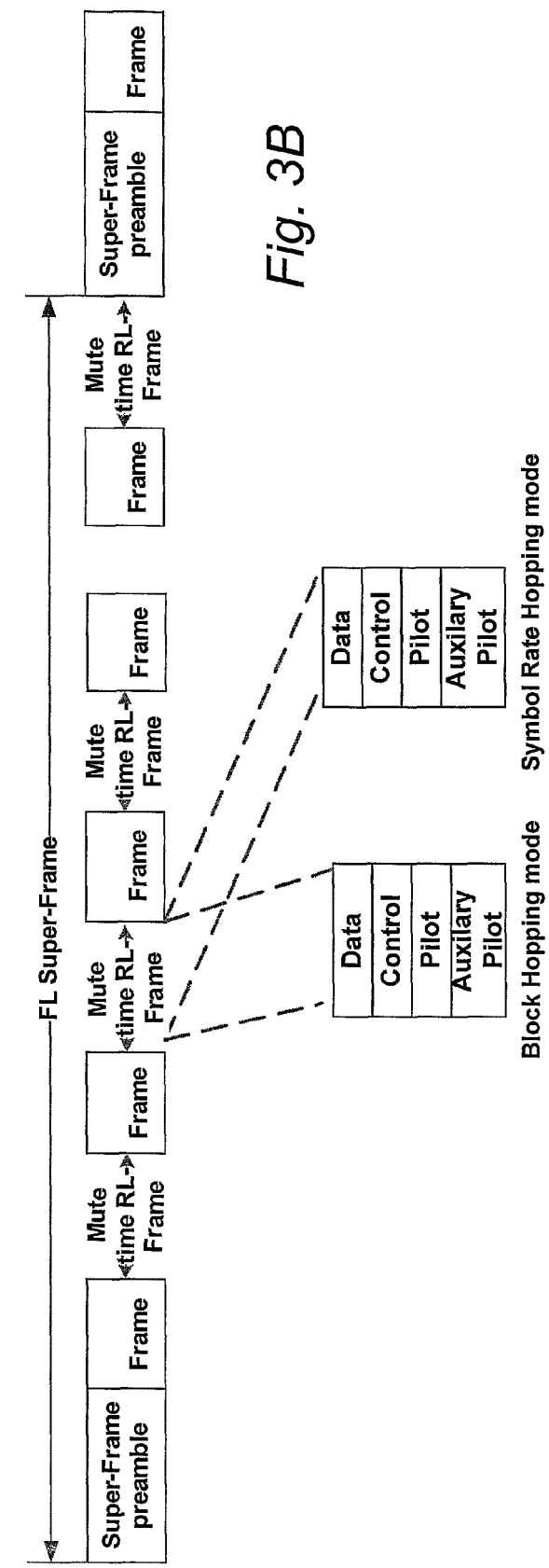

Referring to FIGS. 3A and 3B, embodiments of superframe structures for a multiple access wireless communication system are illustrated. FIG. 3A illustrates embodiments of superframe structures for a frequency division duplexed (FDD) multiple access wireless communication system, while FIG. 3B illustrates embodiments of superframe structures for a time division duplexed (TDD) multiple access wireless communication system. The superframe preamble may be transmitted separately for each carrier or may span all of the carriers of the sector.

In both FIGS. 3A and 3B, the forward link transmission is divided into units of superframes. A superframe may consist of a superframe preamble followed by a series of frames. In an FDD system, the reverse link and the forward link transmission may occupy different frequency bandwidths so that transmissions on the links do not, or for the most part do not, overlap on any frequency subcarriers. In a TDD system, N forward link frames and M reverse link frames define the number of sequential forward link and reverse link frames that may be continuously transmitted prior to allowing transmission of the opposite type of frame. It should be noted that the number of N and M may be vary within a given superframe or between superframes.

In both FDD and TDD systems each superframe may comprise a superframe preamble. In certain embodiments, the superframe preamble includes a pilot channel that includes pilots that may be used for channel estimation by access terminals, a broadcast channel that includes configuration information that the access terminal may utilize to demodulate the information contained in the forward link frame. Further acquisition information such as timing and other information sufficient for an access terminal to communicate on one of the carriers and basic power control or offset information may also be included in the superframe preamble. In other cases, only some of the above and/or other information may be included in this superframe preamble.

As shown in FIGS. 3A and 3B, the superframe preamble is followed by a sequence of frames. Each frame may consist of a same or a different number of OFDM symbols, which may constitute a number of subcarriers that may simultaneously utilized for transmission over some defined period. Further, each frame may operate according to a symbol rate hopping mode, where one or more non-contiguous OFDM symbols are assigned to a user on a forward link or reverse link, or a block hopping mode, where users hop within a block of OFDM symbols. The actual blocks or OFDM symbols may or may not hop between frames.

Communication between an access terminal (for example the transmitter system 250 of FIG. 2) and an access point (for example the transmitter system 210 of FIG. 2) occurs using a communication link and based upon predetermined timing, system conditions, or other decision criteria. The communication link may be implemented using communication protocols/standards such as World Interoperability for Microwave Access (WiMAX), infrared protocols such as Infrared Data Association (IrDA), short-range wireless protocols/technologies, Bluetooth® technology, ZigBee® protocol, ultra wide band (UWB) protocol, home radio frequency (HomeRF), shared wireless access protocol (SWAP), wideband technology such as a wireless Ethernet compatibility alliance (WECA), wireless fidelity alliance (Wi-Fi Alliance), 802.11 network technology, public switched telephone network technology, public heterogeneous communications network technology such as the Internet, private wireless communications network, land mobile radio network, code division multiple access (CDMA), wideband code division multiple access (WCDMA), universal mobile telecommunications system (UMTS), advanced mobile phone service (AMPS), time division multiple access (TDMA), frequency division multiple access (FDMA), orthogonal frequency division multiple (OFDM), orthogonal frequency division multiple access (OFDMA), orthogonal frequency division multiple FLASH (OFDM-FLASH), global system for mobile communications (GSM), single carrier (1X) radio transmission technology (RTT), evolution data only (EV-DO) technology, general packet radio service (GPRS), enhanced data GSM environment (EDGE), high speed downlink data packet access (HSPDA), analog and digital satellite systems, and any other technologies/protocols that may be used in at least one of a wireless communications network and a data communications network.

According to an embodiment, a wireless communication system comprises encoding and modulation. A k- bit packet (generated by an appropriate MAC protocol) may be converted into sequences of modulation symbols (one sequence per sub-packet), for any value of k that satisfies at least one of the following two conditions: (1) k is less than Max Packet-Size and (2) k is a multiple of 8. The procedures may be packet-splitting, Cyclic Redundancy Check (CRC) insertion, encoding, channel interleaving, sequence repetition, scrambling and modulation.

The air link may support two basic encoding structures, namely a rate 1/5 parallel turbo code and a rate 1/3 convolutional code. The rate 1/5 turbo code can be used for values of k larger than 128, while the rate 1/3 convolutional code can be used for values of k less than or equal to 128. the encoding structure is not limited to the rate 1/5 parallel turbo code and/or rate 1/3 convolutional code. Other encoders may be implemented in the encoding structure.

A turbo encoder is a rate 1/5 code that employs two systematic, recursive, convolutional encoders connected in parallel, with an interleaver, the turbo interleaver, preceding the second recursive convolutional encoder. The two recursive convolutional codes are called the constituent codes of the turbo code. The outputs of the constituent encoders are punctured or repeated to achieve the desired number of turbo encoder output bits. The turbo encoder may generate 18 tail output bits following the encoded data output bits. The tail output bits are generated after the constituent encoders have been clocked k times with the switches in the up position. The first 9 tail output bits are generated by clocking Constituent Encoder 1 three times with its switch in the down position while Constituent Encoder 2 is not clocked. The constituent encoder outputs for each bit period may be output in the sequence X, $Y_0$, $Y_1$, with the X output first. The last 9 tail output bits are generated by clocking Constituent Encoder 2 three times with its switch in the down position while Constituent Encoder 1 is not clocked. The constituent encoder outputs for each bit period may be output in the sequence X', $Y_0'$, $Y_1'$, with the X' output first. The tail bit sequence ensures that both constituent encoders achieve the all-zeros state at the end of the encoding process.

The turbo encoder may comprise a turbo interleaver, that block interleave the turbo encoder input data that is fed to Constituent Encoder 2. The turbo interleaver may be functionally equivalent to an approach where the entire sequence of turbo interleaver input bits are written sequentially into an array at a sequence of addresses, and then the entire sequence is read out from a sequence of addresses.

Figure 4A:
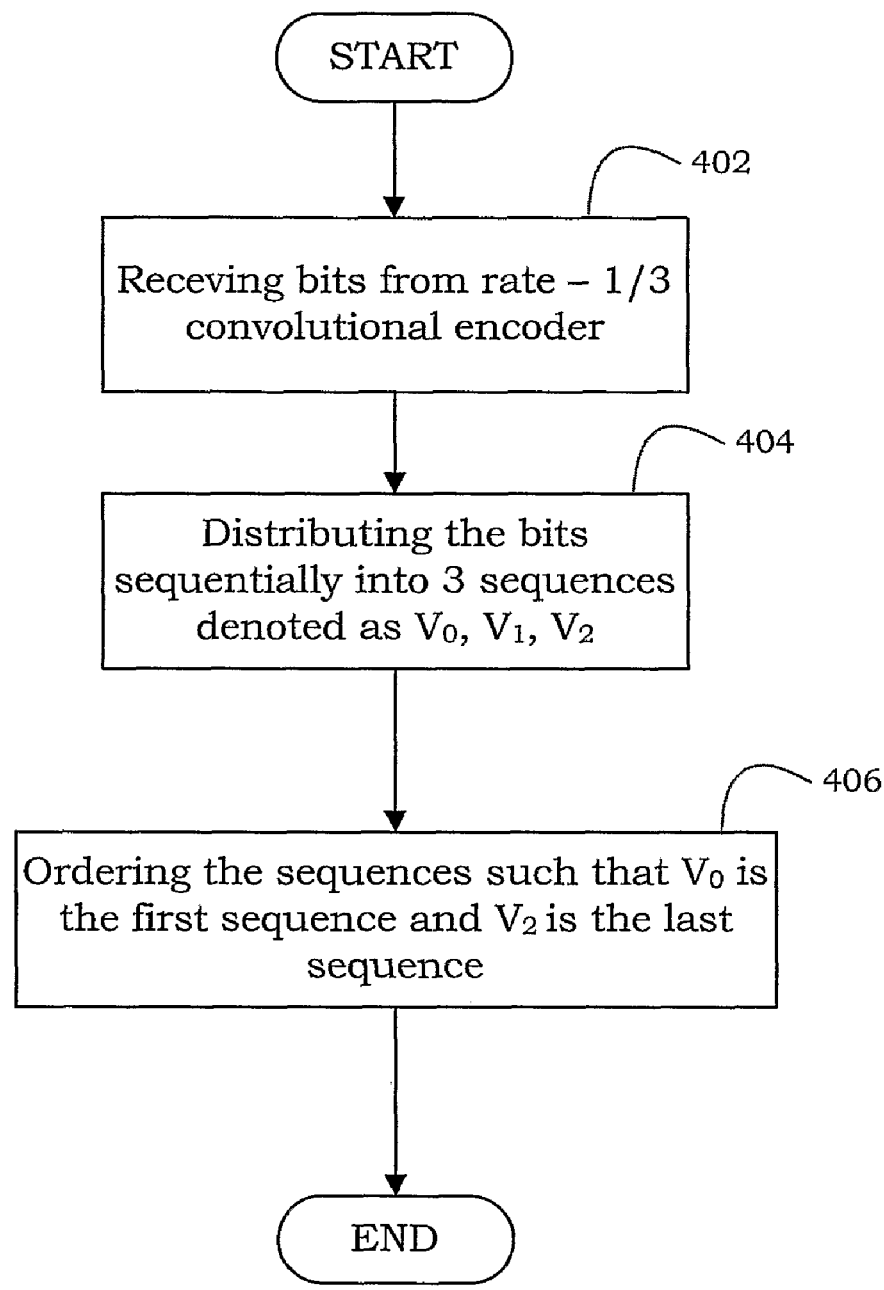
FIG. 4A illustrates a flow diagram of a process of Bit Demultiplexing for a rate 1/3 convolutional encoder.

According to one embodiment, the turbo or convolutional encoding may be followed by channel interleaving, which consists of bit demultiplexing followed by bit permuting. The output bits generated by the rate 1/3 convolutional encoder may be reordered according to the method 400 given in FIG. 4A. FIG. 4A illustrates a flow diagram of the process 400 of bit demultiplexing for a rate 1/3 convolutional encoder, according to an embodiment. At 402, bits from rate 1/3 convolutional encoder are received. At 404, the received bits are distributed sequentially into 3 sequences denoted as $V_0$, $V_1$ and $V_2$. All of the convolutional encoder output bits may be demultiplexed into three sequences denoted as $V_0$, $V_1$ and $V_2$. The encoder output bits may be sequentially distributed from the $V_0$ sequence to the $V_2$ sequence with the first bit going to the $V_0$ sequence, the second bit going to the $V_1$ sequence and the third bit going to the $V_2$ sequence, the fourth to the $V_0$ sequence and so on. At 406, the sequences are ordered such that $V_0$ is the first sequence and $V_2$ is the last sequence. The $V_0$, $V_1$ and $V_2$ sequences may be ordered according to $V_0$, $V_1$ $V_2$.

Figure 4B:
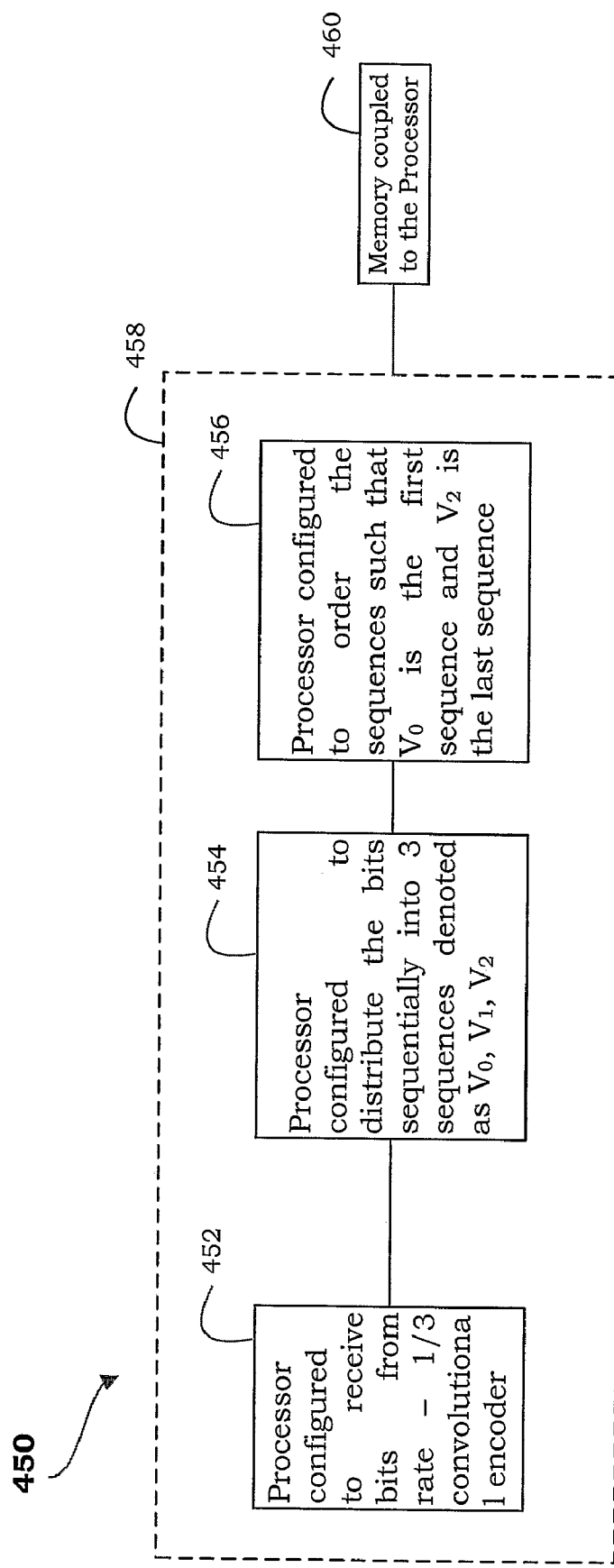
FIG. 4B illustrates one or more processors for Bit Demultiplexing for a rate 1/3 convolutional encoder.

FIG. 4B illustrates a processor 450 for bit multiplexing for 1/3 convolutional encoder. The processor referred to may be electronic devices and may comprise one or more processors to carry out the methodologies for bit multiplexing for 1/3 convolutional encoder. A processor 452 is configured to receive bits from rate 1/3 convolutional encoder are received. A processor 454 is configured to distribute the received bits sequentially into 3 sequences denoted as $V_0$, $V_1$ and $V_2$. All of the convolutional encoder output bits may be demultiplexed into three sequences denoted as $V_0$, $V_1$ and $V_2$. The encoder output bits may be sequentially distributed from the $V_0$ sequence to the $V_2$ sequence with the first bit going to the $V_0$ sequence, the second bit going to the $V_1$ sequence and the third bit going to the $V_2$ sequence, the fourth to the $V_0$ sequence and so on. A processor 456 is configured to order the sequences such that $V_0$ is the first sequence and $V_2$ is the last sequence. The $V_0$, $V_1$ and $V_2$ sequences may be ordered according to $V_0$, $V_1$ $V_2$. The functionality of the discrete processors 452 and 456 depicted in the figure may be combined into a single processor 458. A memory 460 is also coupled to the processor 458.

In an embodiment, an apparatus comprises means for receiving bits from rate 1/3 convolutional encoder. Further, means are provided for distributing the bits sequentially into the three sequences denoted as $V_0$, $V_1$ and $V_2$ further means are provide for ordering the sequences. The means described herein may comprise one or more processors.

Figure 5A:
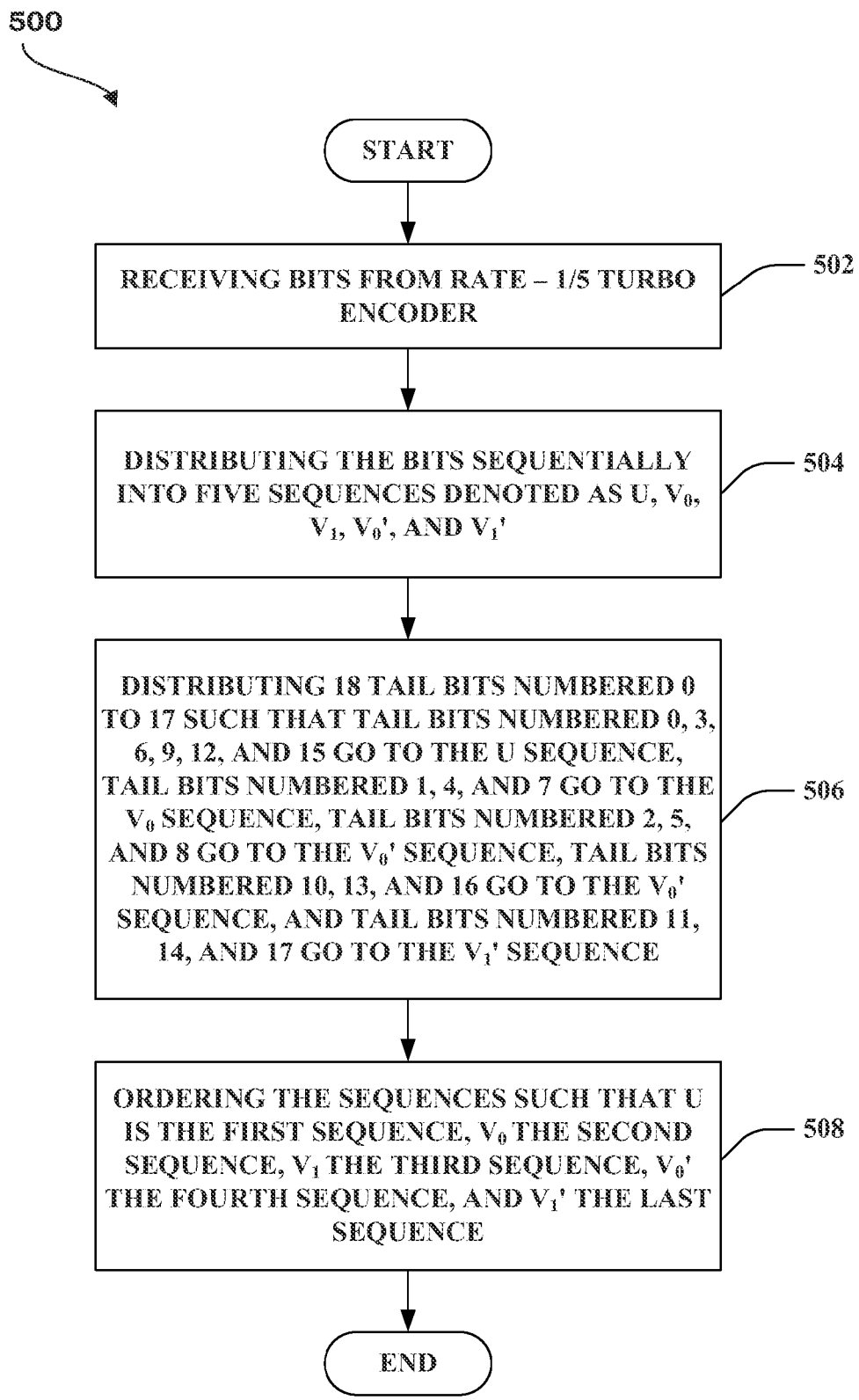
FIG. 5A illustrates a flow diagram of a process of Bit Demultiplexing for a rate 1/5 turbo encoder.

In yet another embodiment the output bits generated by the rate 1/5 turbo encoder may be reordered according to method 500 given in FIG. 5A. FIG. 5A illustrates a flow diagram of the process 500 of bit demultiplexing for a rate 1/5 turbo encoder, according to an embodiment. At 502, bits from rate-1/5 turbo encoder are received. At 504, the received bits are distributed sequentially into five sequences U, $V_0$, $V_1$, $V_0'$ and V'. All of the turbo encoder output data bits (i.e. the 5K bits output in the first k clock periods) may be demultiplexed into five sequences denoted as U, $V_0$, $V_1$, $V_0'$ and $V_1'$. the encoder output bits may be sequentially distributed from the U sequence to the $V_1'$ sequence with the first encoder output bit going to the U sequence, the second to the $V_0$ sequence, the third to the $V_1$ sequence, the fourth to the $V_0'$ sequence, the fifth to the $V_1'$ sequence, the sixth to the U sequence and so on. At 506, the 18 tail bits numbered 0 through 17 (i.e. the 18 bits generated during the last six clock periods) may be distributed. Tail bits numbered 0, 3, 6, 9, 12 and 15 may go to the U sequence, the tail bits numbered 1, 4 and 7 may go to the $V_0$ sequence, the tail bits numbered 2, 5 and 8 may go to the $V_0'$ sequence, the tail bits numbered 11, 14 and 17 may go to the $V_1'$ sequence. The tail bits of each non systematic stream are allocated to the corresponding sequence. At 508, the sequences U, $V_0$, $V_1$, $V_0'$ and $V_1'$ are ordered according to U $V_0$ $V_0'$ $V_1$ $V_1'$. The U sequence may be the first and the $V_1'$ sequence may be the last sequence.

Figure 5B:
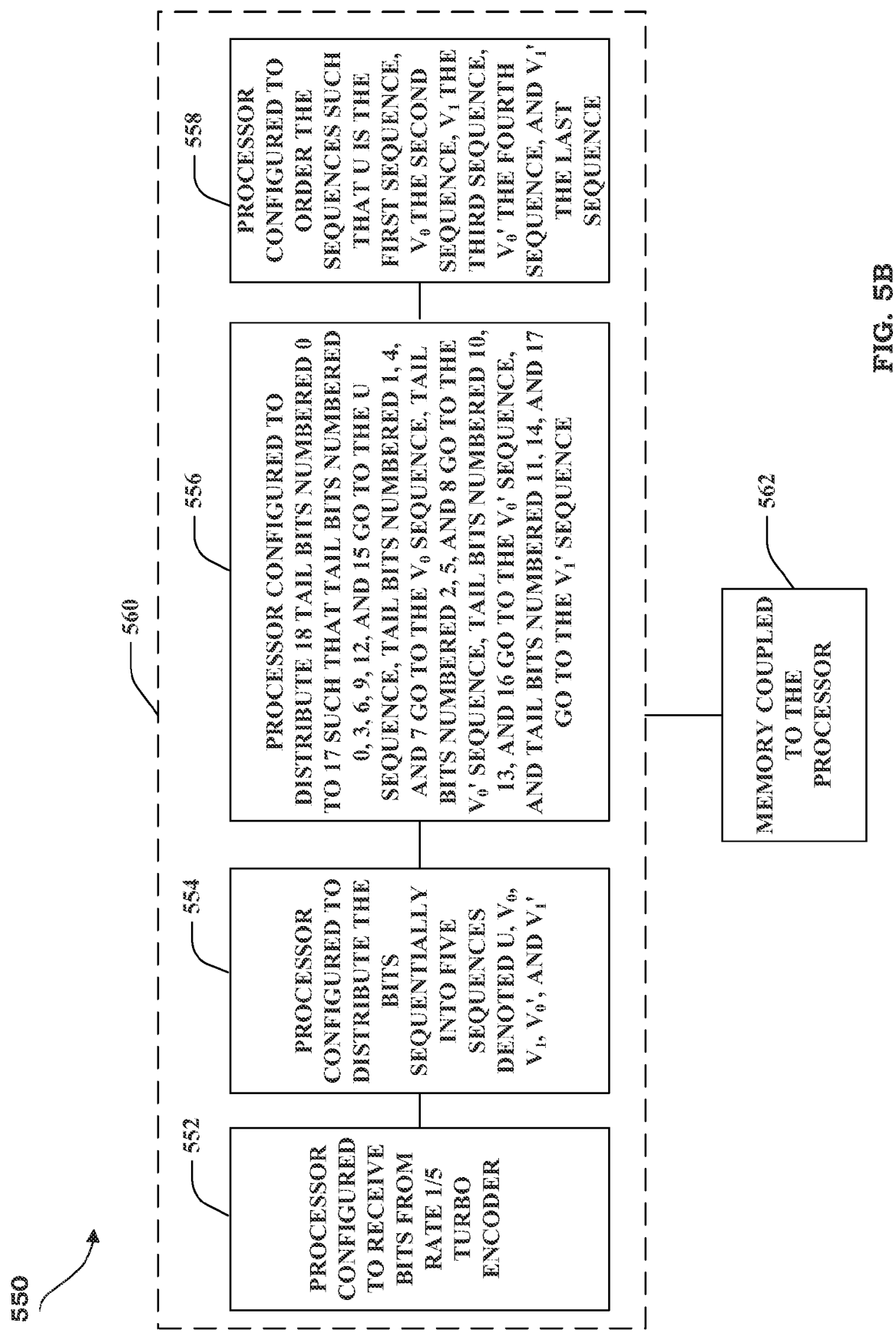
FIG. 5B illustrates one or more processors for Bit Demultiplexing for a rate 1/5 turbo encoder.

FIG. 5B illustrates a processor 550 for bit multiplexing for 1/5 turbo encoder. The processor referred to may be electronic devices and may comprise one or more processors to carry out the methodologies for bit multiplexing for 1/5 turbo encoder. A processor 552 is configured to receive bits from rate-1/5 turbo encoder. A processor 554 is configured to distribute the received bits sequentially into five sequences U, $V_0$, $V_1$, $V_0'$ and $V_1'$. All of the turbo encoder output data bits (i.e.) the 5K bits output in the first k clock periods) may be demultiplexed into five sequences denoted as U, $V_0$, $V_1$, $V_0'$ and $V_1'$. the encoder output bits may be sequentially distributed from the U sequence to the $V_1'$ sequence with the first encoder output bit going to the U sequence, the second to the $V_0$ sequence, the third to the $V_i$ sequence, the fourth to the $V_0'$ sequence, the fifth to the $V_1'$ sequence, the sixth to the U sequence and so on. A processor 556 is configured to distribute the 18 tail bits numbered 0 through 17 (i.e. the 18 bits generated during the last six clock periods). Tail bits numbered 0, 3, 6, 9, 12 and 15 may go to the U sequence, the tail bits numbered 1, 4 and 7 may go to the $V_0$ sequence, the tail bits numbered 2, 5 and 8 may go to the $V_0'$ sequence, the tail bits numbered 11, 14 and 17 may go to the $V_1'$ sequence. The tail bits of each non systematic stream are allocated to the corresponding sequence. A processor 558 is configured to order the sequences U, $V_0$, $V_1$, $V_0'$ and $V_1'$ according to U $V_0$ $V_0'$ $V_1$ $V_1'$. The U sequence may be the first and the $V_1'$ sequence may be the last sequence. The functionality of the discrete processors (e.g., 552, 554, 556, and 558) depicted in the figure may be combined into a single processor 560. A memory 562 is also coupled to the processor 560.

In an embodiment an apparatus comprises means for receiving bits from rate 15 turbo encoder. Further, means are provided for distributing the bits sequentially into 5 sequence denoted as U, $V_0$, $V_1$, $V_0'$ and $V_1'$. Further, means are provided for distributing 18 tail bits numbered 0 through 17 and order in the five sequences as U $V_0$ $V_0'$ $V_1$ $V_1'$. The means described herein may comprise one or more processors.

Furthermore, embodiments may be implemented by hardware, software, firmware, middleware, microcode, or any combination thereof. When implemented in software, firmware, middleware or microcode, the program code or code segments to perform the necessary tasks may be stored in a machine readable medium such as a separate storage(s) not shown. A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Various modifications to these embodiments will be readily apparent to those skilled in the art, and the generic principles defined herein may be applied to other embodiments. Thus, the description is not intended to be limited to the embodiments shown herein but is to be accorded the widest scope consistent with the principles and novel features disclosed herein.

We claim:

1. A method of bit demultiplexing for a rate 1/5 turbo encoder in a wireless communication system, comprising:
   receiving bits from a rate 1/5 turbo encoder;
   demultiplexing the received bits by distributing the bits sequentially into five sequences denoted as U, $V_0$, $V_1$, $V_0'$ and $V_1'$, where the first bit goes to the U sequence, the second to the $V_0$ sequence, the third to the $V_1$ sequence, the fourth to the $V_0'$ sequence, and the fifth goes to the $V_1'$ sequence;
   distributing 18 tail bits numbered 0 through 17, where tail bits numbered 0, 3, 6, 9, 12 and 15 go to the U sequence, tail bits numbered 1, 4 and 7 go to the $V_0$ sequence, tail bits numbered 2, 5 and 8 go to the $V_1$ sequence, tail bits 10, 13 and 16 go to the $V_0'$ sequence, and tail bits numbered 11, 14 and 17 go to the $V_1'$ sequence; and
   ordering the sequences where U is the first sequence, $V_0$ is the second sequence, $V_0'$ is the third sequence, $V_1$ is the fourth and $V_1'$ is the last sequence.

2. A computer readable medium including instructions thereon, comprising:
   a set of instructions for receiving bits from a rate 1/5 turbo encoder;
   a set of instructions for demultiplexing the received bits by distributing the bits sequentially into five sequences denoted as U, $V_0$, $V_1$, $V_0'$ and $V_1'$ where the first bit goes to the U sequence, the second to the $V_0$ sequence, the third to the $V_1$ sequence, the fourth to the $V_0'$ sequence and the fifth goes to the $V_1'$ sequence;
   a set of instructions for distributing 18 tail bits numbered 0 through 17, where tail bits numbered 0, 3, 6, 9, 12 and 15 go to U sequence, tail bits numbered 1, 4 and 7 go to the $V_0$ sequence, tail bits numbered 2, 5 and 8 go to the $V_1$ sequence, tail bits numbered 10, 13 and 16 go to the $V_0'$ sequence, and tail bits numbered 11, 14 and 17 go to the $V_1'$ sequence; and
   a set of instructions for ordering the sequences where U is the first sequence, $V_0$ is the second sequence, $V_0'$ is the third sequence, $V_1$ is the fourth and $V_1'$ is the last sequence.

3. An apparatus operable in a wireless communication system, comprising:
   means for receiving bits from a rate 1/5 turbo encoder;
   means for demultiplexing the received bits by distributing the bits sequentially into five sequences denoted as U, $V_0$, $V_1$, $V_0'$ and $V_1'$, where the first bit goes to the U sequence, the second to the $V_0$ sequence, the third to the $V_1$ sequence, the fourth to the $V_0'$ sequence and the fifth goes to the $V_1'$ sequence;
   means for distributing 18 tail bits numbered 0 through 17, where tail bits numbered 0, 3, 6, 9, 12 and 15 go to the U sequence, tail bits numbered 1, 4 and 7 go to the $V_0$ sequence, tail bits numbered 2, 5 and 8 go to the $V_1$ sequence, tail bits numbered 10, 13 and 16 go to the $V_0'$ sequence and tail bits numbered 11, 14 and 17 go to the $V_1'$ sequence; and
   means for ordering the sequences where U is the first sequence, $V_0$ is the second sequence, $V_0'$ is the third sequence, $V_1$ is the fourth and $V_1'$ is the last sequence.

4. A wireless communications apparatus, comprising:
   at least one processor configured to:
   receive bits from a rate 1/5 turbo encoder;
   demultiplex the received bits by distributing the bits sequentially into five sequences denoted as U, $V_0$, $V_1$, $V_0'$ and $V_1'$, where the first bit goes to the U sequence, the second to the $V_0$ sequence, the third to the $V_1$ sequence, the fourth to the $V_0'$ sequence, and the fifth going to the $V_1'$ sequence;
   distribute 18 tail bits numbered 0 through 17, where tail bits numbered 0, 3, 6, 9, 12 and 15 go to the U sequence, tail bits numbered 1, 4 and 7 go to the $V_0$ sequence, tail bits numbered 2, 5 and 8 go to the $V_1$ sequence, tail bits numbered 10, 13 and 16 go to the $V_0'$ sequence, and tail bits numbered 11, 14 and 17 go to the $V_1'$ sequence; and
   order the sequences such that U is the first sequence, $V_0$ is the second sequence, $V_0'$ is the third sequence, $V_1$ is the fourth and $V_1'$ is the last sequence.

* * * * *